(12) United States Patent
Bartolomé García et al.

(10) Patent No.: US 8,249,757 B2
(45) Date of Patent: Aug. 21, 2012

(54) METHOD AND SYSTEM FOR DETECTION OF STANDBY STATUS IN LINEAR AND NON-LINEAR CHARGES CONNECTED TO THE ELECTRICITY MAINS AND AUTOMATIC DISCONNECTION THEREOF

(75) Inventors: Jesús Bartolomé García, Madrid (ES); José Angel Zabalegui Labarta, Madrid (ES); Antoni Sudrià Andreu, Barcelona (ES); Joan Gabriel Bergas Jane, Barcelona (ES); Miquel Teixido Casas, Barcelona (ES)

(73) Assignee: Good For You Good For The Planet, S.L., Madrid (ES)

( * ) Notice: Subject to any disclaimer, the term of this patent is extended or adjusted under 35 U.S.C. 154(b) by 199 days.

(21) Appl. No.: 12/600,680

(22) PCT Filed: May 18, 2007

(86) PCT No.: PCT/ES2007/000291
§ 371 (c)(1),
(2), (4) Date: Feb. 4, 2010

(87) PCT Pub. No.: WO2008/142173
PCT Pub. Date: Nov. 27, 2008

(65) Prior Publication Data
US 2010/0152916 A1  Jun. 17, 2010

(51) Int. Cl.
*G05D 9/00* (2006.01)
*G05F 1/10* (2006.01)
*G06F 1/00* (2006.01)

(52) U.S. Cl. ........... 700/295; 700/22; 327/544; 713/323
(58) Field of Classification Search ............ 700/22, 700/295, 296; 713/320, 323, 324; 327/544; 365/227; 455/574
See application file for complete search history.

(56) References Cited

U.S. PATENT DOCUMENTS 6,472,857 B1 * 10/2002 Genest et al. ............... 323/303
7,460,930 B1 * 12/2008 Howell et al. ............... 700/295

FOREIGN PATENT DOCUMENTS

| DE | 196 35 826 A1 | 3/1998 |
| EP | 0 571 718 A2 | 12/1993 |
| EP | 1 708 331 A2 | 4/2006 |
| WO | 93 09634 A1 | 5/1993 |
| WO | 2007 027063 A1 | 3/2007 |

* cited by examiner

*Primary Examiner* — Sean Shechtman
(74) *Attorney, Agent, or Firm* — Tristan A. Fuierer; Andrew D. Gerschutz; Moore & Van Allen, PLLC

(57) ABSTRACT

A method is provided that permits the detection of 'standby' state' in linear and non-linear loads connected to the power grid and their automatic disconnection. The method includes five main stages: a) detecting the normal operating state of at least one load by a detection device, b) obtaining the maximum value of the current in the operating state, c) detecting entry into 'standby' mode' by the load by establishing the 'standby' state' when the current value measured at a specific time in each load is less than a percentage P of the maximum value of the current of each load in normal operating state, d) evaluating the value for each load for a predetermined time T, and e) disconnecting the load and the detection device when value T of time is reached without the load having returned to the normal operating state. A system is also provided.

21 Claims, 1 Drawing Sheet

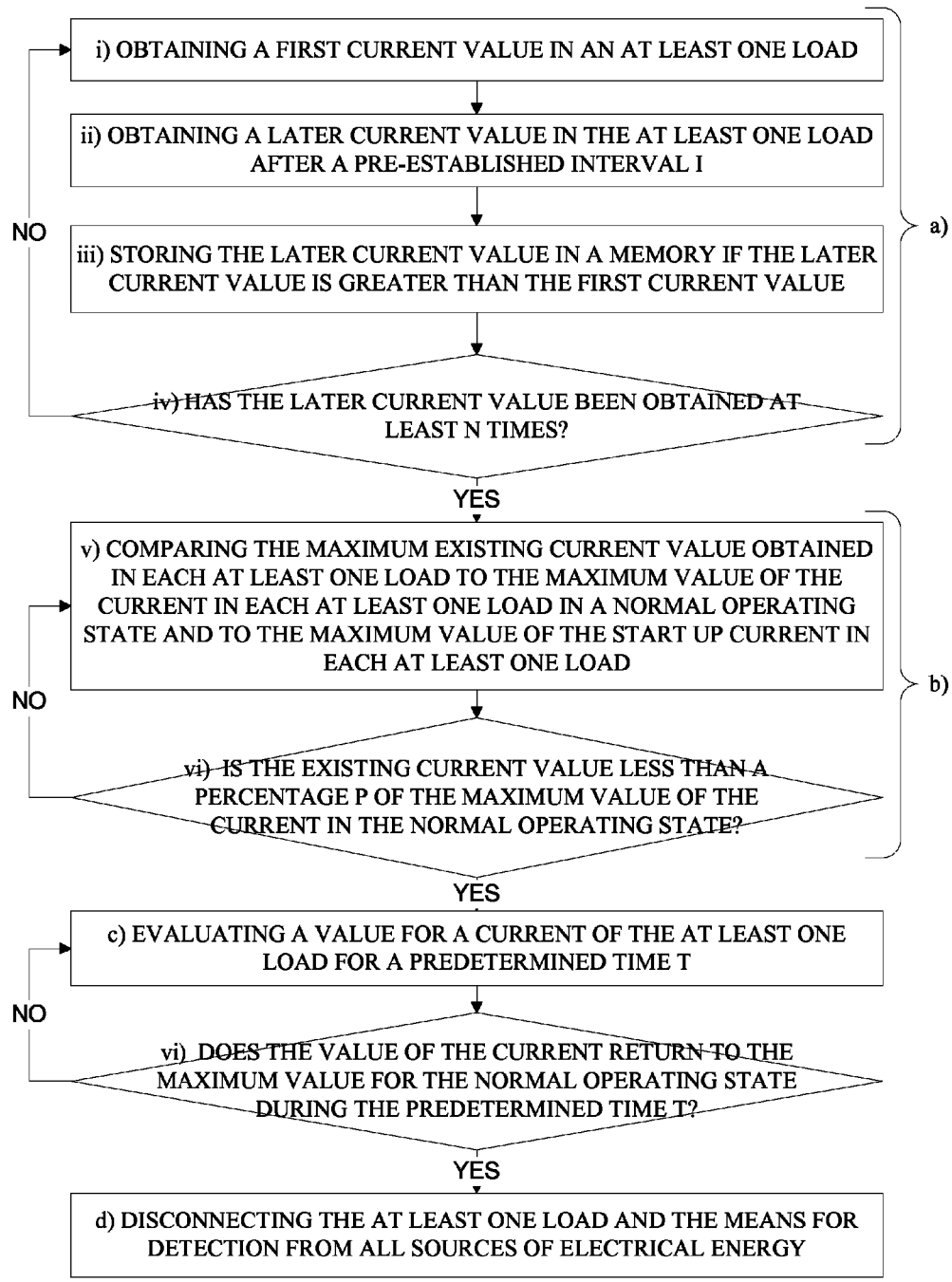

METHOD AND SYSTEM FOR DETECTION OF STANDBY STATUS IN LINEAR AND NON-LINEAR CHARGES CONNECTED TO THE ELECTRICITY MAINS AND AUTOMATIC DISCONNECTION THEREOF

CROSS-REFERENCE TO RELATED APPLICATIONS

This application is filed under the provisions of 35 U.S.C. §371 and claims the priority of International Patent Application No. PCT/ES2007/000291 filed on 18 May 2009 entitled "Method and System for Detection of Standby Status in Linear and Non-Linear Charges Connected to the Electricity Mains and Automatic Disconnection Thereof" in the name of Jesús Bartolomé García, et al., which is hereby incorporated by reference herein in its entirety.

TECHNICAL FIELD OF THE INVENTION

The field of application of the invention is within the industrial sector of electrical energy in general, and more particularly in the field of reduction and saving of electrical consumption in linear and non-linear loads connected to the power grid which are in 'standby' or energy saving situation. The method and system of the invention are applicable in the industrial and tertiary sector, and in particular in the domestic field.

BACKGROUND OF THE INVENTION

At present, a large quantity of electrical devices, such as videos, televisions, monitors, printers, photocopiers, etc., have an operating state mode known as waiting or 'standby' mode. Said state is similar for the user to a mode of disconnection of the apparatus, but, in fact, this is not the case, since the apparatus remains connected, consuming electrical energy.

Years ago, the disconnection of a piece of equipment literally meant this, the total disconnection of said equipment, and, therefore, that the consumption thereof was zero, or, in other words, the electricity meter did not record any consumption. Nowadays, however, the meters continue to record consumption, and the reason for this, among others, is the consumption of appliances in 'standby' mode'.

Increasingly frequently, electrical appliances are designed to be connected to electricity 24 hours a day, 7 days a week, and part of the electrical consumption of those appliances occurs when the apparatus is not really being used, but while the electrical appliance is in 'standby' mode'. In some products, such as printers or photocopiers, the 'sleep' or 'standby' mode entails an important saving. Even so, these appliances record the greatest consumption levels in 'standby' among office computer systems and other electrical appliances.

It is precisely the fact that the appliances are connected 24 hours a day which cause that, although the consumption in 'standby' of an apparatus is relatively low with respect to its consumption in normal or working mode, in absolute terms it is practically equivalent to it, since the number of hours that it consumes energy whilst it remains on 'standby' is much higher.

Various recent studies state that between 5 and 13 percent of electricity of domestic use consumed in developed countries may be attributed to appliances on 'standby', and it is forecast that this FIGURE will continue to increase due to the progressive increase in electrical appliances, computers and other electrical or electronic appliances, both in the home and in the office.

To avoid these consumptions arising from electrical appliances or other equipment provided with this 'standby' operating mode, there are solutions that in one or another way detect that the corresponding equipment is for a certain time in operating mode and after said time automatically disconnects. The disadvantages of this type of solutions are varied, but the difficulty in the measurement or calculation of the power which determines that a piece of equipment is in 'standby' mode' is especially notable, and consequently, the reliability and the response in its operation, i.e. the non-disconnection or the undue disconnection of the apparatus.

Other more imaginative solutions try to detect the presence of a user which theoretically is using the apparatus. In the case of solutions which whereby, for example a presence sensor, detect the presence of a user, and which therefore serves as criteria to determine when an appliance should be disconnected. As is evident, these solutions have, among others, the problem of reliably detecting when said user is present, since on many occasions, prolonged periods with absence of movement by the user could be interpreted as the absence thereof, and therefore, an erroneous disconnection could be determined. In turn, this type of solution also has the reverse problem, i.e. that the user is present in the place where the appliances are found but is not using them, for which reason, no type of energy saving is achieved.

A known method to detect that a piece of equipment has gone into 'standby' consists of calculating or measuring the current power that it is consuming, and to make said measurement of the power, it is necessary to differentiate between linear and non-linear loads.

A linear load, such as, for example, a water heater, as it is supplied by a sinusoidal voltage, will also consume a sinusoidal current. In this type of loads, the power calculation is relatively easy since it only depends on RMS values of voltage and current and on the power factor. The calculation of the RMS value is very simple since, as they are sinusoidal waves, the RMS value is the peak value of the wave divided by the root of two.

A non-linear load, with a sinusoidal supply voltage, will not consume a sinusoidal current but a distorted wave. In this case the calculation of the power consumed by these loads is complex since as they are not sinusoidal waves the power is not proportional to the product of the RMS values of voltage and current and the power factor. In this case, neither does the RMS value of the wave correspond to the maximum value divided by the root of two. Electronic equipment is typically non-linear loads since they integrate power sources to convert the sinusoidal voltage of 230 Vrms of the grid in a DC voltage of values generally lower than 24 Vdc.

Since these detection solutions of the 'standby' mode' operate both with linear loads and non-linear loads, but especially with the latter since it is the electronic equipment which incorporates low consumption modes, the method of power calculation cannot be based on the measurement of RMS values and the power factor. A more sophisticated method of calculation based on the average of the instantaneous value of the power throughout a defined time period should be used:

$$P = \frac{1}{T}\int v(t) \cdot i(t) dt = \frac{1}{N} \cdot \sum_{k=0}^{N} v(k) \cdot i(k)$$

This alternative 'standby' detection therefore demands instantaneous measurements of voltage and current as well as an important calculation power.

Another problem associated to this detection method is that it is necessary to define a power threshold value from which it is considered that a piece of equipment has entered in standby mode. The problem arises when we have to define this threshold value. On the one hand, the 'standby' consumption is quite different when we consider different types of appliances, for example, a television and a printer. On the other hand, furthermore, the 'standby' consumption is quite different within the same type of appliance according to their age, manufacturer, etc.

To all the above, we have to add that the circuits devoted to calculating power also have a residual consumption which in cases is quite considerable, which directly clashes with the objective for which they were created.

DESCRIPTION OF THE INVENTION

The objectives of the invention are achieved by a method and system for the detection of 'standby' state' in linear and non-linear loads connected to the power grid and the automatic disconnection thereof, said method comprising the following stages:
   a) Detection of the normal operating state of the at least one load by means of detection, obtaining the maximum value of the current in said operating state,
   b) Detection of entry into 'standby' mode' of the at least one load by the means of detection establishing said 'standby' state' when the existing current value obtained in each load is less than a percentage P of the maximum value of the current of each load in normal operating state,
   c) Start of means of timing at a determined time T for each load when it goes into 'standby' mode', and
   d) Disconnection of the at least one load and of the means of detection when value T is reached of the means of timing without the at least one load having returned to normal operating state.

The method is based on the fact that whether it is a linear or non-linear load, the peak current consumed should undergo an important variation. This method has clear advantages with respect to the calculation method of the aforementioned power consumed: it is only necessary to sense the current consumed by the load and the calculation which is has to perform is minimum. These advantages are translated in a saving in components, space of printed circuit board and microprocessor price. Another advantages are that it is not necessary to define a threshold value if the equipment is capable of "learning" the value in normal operation and from this to detect an important variation.

In a particular embodiment, stage a) of the detection method of 'standby' state', i.e. that corresponding to the production of the maximum value of the current in a load in normal operating state also comprises the following stages:
   i) Obtainment of a first current value in the load,
   ii) Obtainment of a later current value in the load after a pre-established interval,
   iii) Verification if the current value in the load is greater than the previous value and in said case storage of the current value in means of memory,
   iv) Repetition of stages i) to iii) a determined number of times.

Advantageously, stages i) to iv) of the phase of production of the maximum current value in normal operating state is repeated a determined number of times and the average of all the means of the maximum current values obtained is achieved.

In a particular embodiment, stage b) of detection of entry in 'standby' mode' of at least one load also comprises the following stages:
   v) Comparison of the maximum existing current value obtained in each load and, the maximum value of the current in each load in normal operating state, and the to normal of each load, and
   vi) Establishment of said 'standby' state' when the existing value obtained in each load is less than a percentage of the maximum value of the current of each load in normal operating state Aforementioned stage v) is justified so that the method and system of the invention can act in the three cases described below.

It is detected that some loads, in general low power, do not modify the peak current consumed if it is in 'standby' at the time of the connection. This behaviour causes that the method of the invention does not disconnect said loads if said load or appliance is not used, i.e. it is not started and turned off (ON—OFF transition). Examples of this type of loads are satellite TV decoders, games consoles, etc. . . . . Said behaviour is different in the case of computer screens, printers and other loads which, although they were in 'standby' operating mode at the time of connection, always have an important variation in the maximum value of the current.

When a load is supplied from the power grid:
   Some loads start up in normal operating mode and after a time, in general a few seconds at most, enter 'standby' mode'. As an example, we can cite a printer or a computer screen, which initially starts up in normal mode and if it does not detect a PC connected, it goes to 'standby' mode'.
   Some loads start up in 'standby' mode' if they were in this state when they were switched off (OFF mode). As examples we can cite: decoders, DVD and video players, sound systems, games consoles and televisions.

Thus, on using the method and system of the invention, three cases may arise:
   1. that the load is of the first type, i.e. it starts up in normal operating mode and enters 'standby' mode' after a few seconds, and therefore, it will produce a clear variation in current peaks consumed,
   2. that there is no load connected and, therefore, no variations occur in the reading of the maximum or peak current, the load current being under a determined value (load not unconnected), or
   3. that there is a load connected of the second type, i.e. with start-up in 'standby' mode' if when switched off they were is said state, so that variations do not occur in the peak current reading, but in this case it is above the determined value of 'load not connected'.

As has been indicated, said stage v) permits that the method and system of the invention can act in the three mentioned cases.

On the other hand, said stage v) of comparison, within stage b) of detection of entry in 'standby' mode', permits contemplating five possible scenarios.

In first place, the method for the detection of 'standby' state' establishes that, when the maximum existing current value in each load is greater than the maximum current value in the normal operating mode stored previously in the means of memory, the maximum existing current value replaces and is stored instead of that previous stored in the means of memory.

In the same way, the method establishes that, when the maximum existing current value in each load is less than the maximum current value in normal operating mode stored in the means of memory and greater than the determined percentage of the maximum current value of each load in the normal operating state, it is considered that the load is within the normal operating state.

On the other hand, the method establishes that, when the maximum existing current value in each load is less than the maximum current value in normal operating mode stored in the means of memory and below the determined percentage of the maximum value of the current of each load in the normal operating state, the load is considered in 'standby' state.

The method for the detection of 'standby' state also establishes that, when the maximum existing current value in each load is less than the maximum current value in normal operating mode stored in the means of memory and less than a specific value (reduced) of the current of each load in normal operating state, it is considered that the load is disconnected, or, in other words, there is no appliance or load connected to the system.

This condition obeys the need to not take into consideration the electric "noise" that any electrical appliance always has, and which logically does not correspond to a real consumption value in 'standby' mode'.

Finally, the method for the detection of 'standby' state' establishes that, when the maximum existing current value in the load is between the two following values: Maximum current value in Start-up minus an HS value, and, Maximum current value in Start-up plus the HS value, it is considered that the appliance or load is in 'standby' mode' from when it was started. The HS value corresponds to a hysteresis which is entered to avoid that small noises in the measurement do not permit the action of the 'standby' detection system.

In a second aspect, the invention relates to a system for the detection of 'standby' state' in linear and non-linear loads connected to the power grid and the disconnection thereof, which comprises:

a) Means of detection of the normal operating state of the at least one load obtaining the maximum value of the current in said operating state, b) Means of detection of entry in 'standby' mode' of the at least one load establishing said 'standby' state' when the existing value of current obtained in each load is less than a percentage P of the maximum value of the current of each load in normal operating state, c) Means of timing at a determined time T for the at least one load when it enters in 'standby' mode', and d) Means of disconnection of the at least one load and of the means of detection when the value T of the means of timing is reached without the at least one load having returned to normal operating state.

In a particular embodiment, the system for the detection of 'standby' state' also comprises means of reactivation of the system, which after 'switching off' or disconnection thereof when all the loads have gone into 'standby' operating mode during the determined time and established for that purpose, permit the reactivation or resetting of the system, i.e. the re-start up to be able to detect the 'standby' mode'.

In a last aspect, the invention relates to means of program coding adapted to execute one or several stages of the detection method in the described 'standby' mode.

In short, it can be concluded that the 'standby' detection method mode' of the invention has a series of advantages which redound in a simplification of the method, less cost, both of the sensing elements and the associated microprocessor, and in particular, for an embodiment with mechanical reactivation means, the zero consumption of the detection device when this disconnects all the loads. In turn, the detection method by variation of the current peak consumed in the load or loads has the advantage that it is 100% automatic and it is only necessary to detect important current variations and that, therefore, it is not necessary to have great precision or a large calculation power.

BRIEF DESCRIPTION OF THE DRAWING

To complement the description being made, and in order to help towards a better understanding of the characteristics of the invention, in accordance with a preferred and practical embodiment thereof, a single FIGURE is attached as an integral part of said description, wherein with an illustrative and non-limitative character, a flow chart has been represented which implements the 'standby' detection method of the present invention.

DESCRIPTION OF A PREFERRED EMBODIMENT

Below, a preferred embodiment of the 'standby' detection method of the invention is described by means of a functional diagram represented in FIG. 1.

The method starts with two main parts a) and b). During the first part a) (stages i) to iv)) the maximum current value is sought, and it is stored as start-up peak value; then, the second part b) (stages v) to vi)) of the method start, where this "supervises" if the appliance or load enters in 'standby' mode. To do this, the maximum existing current value is sought and it is compared with the maximum value in normal operating state and with the to normal.

More particularly, the first part of method a), comprises the following stages:

Stage i): Obtainment of a first current value in the load,

Stage ii): Obtainment of a later current value in the load after a pre-established interval I Stage iii): Verification if the existing value in the load is greater than the previous value and in said case storage of the existing value in means of memory, Stage iv) Repetition of stages i) to iii) a determined number N of times.

Preferably, the value of interval I is between 0.1 ms and 1 ms, and particularly, the interval I is 0.5 ms.

On the other hand, preferably, the value of the number of times N that stages 1 to 3 is repeated is between 20 and 200, and particularly N is 40.

To obtain a more precise maximum value, part a) of the method is repeated a number of times M and then the average is calculated. Preferably, the number of times M that part a) of the method is repeated is between 2 and 16, and particularly M is 8.

Part b) of the method, i.e. that relative to the "supervision" of whether the appliance or load enters in 'standby' mode comprises the following stages;

Stage v): Comparison of the maximum existing current value obtained in each load and; the maximum value of the current in each load in normal operating state and the maximum value of the start-up current, and Stage vi): Establishment of said 'standby' state' when the existing value obtained in each load is less than a percentage P of the maximum value of the current of each load in normal operating state.

The comparison made in stage v) of part b) of the method poses five possible scenarios:

That the maximum existing current value in each load is greater than that stored in the means of memory. This means that the maximum normal operating current value which has been read is not correct, and the existing value is stored as normal operating value. In other words, the method and the system "learn" the new normal operating value.

That the maximum existing current value is less than that stored in the means of memory but is more than a percentage P of the maximum value of the current of each load in normal operating state. It is considered, in this case, that that the appliance or load is in normal operating mode.

That the maximum existing current value is less than that stored in the means of memory and is less than percentage P of the maximum value of the current of each load in normal operating state. In this case it is considered that the appliance or load has gone into 'standby' operating mode.

That the maximum existing current value is less than a threshold U of the current of each load in normal operating state. In this situation it is considered that there is no appliance or load connected to the system, That the maximum existing current value is between the two following values: Maximum current value in Start-up minus an HS value, and Maximum current value in Start-up plus the HS value. It is considered that the appliance or load is in 'standby' mode' from when it is started. The value of HS corresponds to a hysteresis which is introduced to avoid that small noises in the measurement do not permit the action of a standby detector system.

Preferably, the value of P is between 30% and 50%, and particularly P is 50%. On the other hand, both the preferred value of U and that of HS is approximately 100 mA.

Subsequently, in the cases where it is considered that the load is in 'standby' mode or in 'not connected' mode, a timer T is started for each load. Finally, the load and the means of detection are disconnected when value T of the timer is reached without the load having returned to normal operating state. One of the main advantages of the method and system of the invention is again underlined, i.e. the zero consumption of the system when the load is disconnected, as the means of detection are also disconnected. In said situation, the system reset is carried out by mechanical reactivation means, such as, for example the pushing of a button provided for said purpose.

When a load wherein 'standby' has been detected, and consequently the timer T had been started, goes on to normal operating state, the timer is reset.

The invention claimed is:

1. A computer-implemented method for detection of 'standby' state' in linear and non-linear loads connected to an electric power grid and automatic disconnection of the linear and non-linear loads for achieving zero consumption in a system, the method comprising:
   a) detecting a normal operating state of at least one load using a means for detection;
   b) obtaining a maximum value of a current in the at least one load in the normal operating state;
   c) detecting entry into a standby mode of the at least one load, by means of a computing device processor, wherein the standby mode is detected when a value of the current in the at least one load at a specific time is less than a percentage P of the maximum value of the current of the at least one load in the normal operating state;
   d) evaluating a value for a current of the at least one load for a predetermined time T; and
   e) disconnecting the at least one load and the means for detection from all sources of electrical energy when the value of the at least one load does not return to the maximum value during the predetermined time T.

2. The method for the detection of 'standby' state' according to claim 1, wherein the maximum value is obtained by:
   i) obtaining a first current value in the at least one load;
   ii) obtaining a later current value in the at least one load after a pre-established interval of time I;
   iii) determining if the later current value is greater than the first current value;
   iv) storing the greater of the first current value and the later current value in memory; and
   v) repeating stages i) to iv) a pre-determined number N times.

3. The method for the detection of 'standby' state' according to claim 2, wherein the pre-established interval of time I is between 0.1 ms and 1 ms.

4. The method for the detection of 'standby' state' according to claim 3, wherein the pre-established interval of time I is 0.5 ms.

5. The method for the detection of 'standby' state' according to claim 2, wherein the pre-determined number N is between 20 and 200.

6. The method for the detection of 'standby' state' according to claim 5, wherein the pre-determined number N is 40.

7. The method for the detection of 'standby' state' according to claim 2, wherein stages i) to v) for obtaining the maximum value of the current of a load in normal operating state are repeated a number of times M and the average of all the maximum current values obtained is determined.

8. The method for the detection of 'standby' state' according to claim 7, wherein M is between 2 and 16.

9. The method for the detection of 'standby' state' according to claim 8, wherein M is 8.

10. The method for the detection of 'standby' state' according to claim 1, wherein stage c) of detecting entry into 'standby' mode' comprises:
    v) obtaining a maximum start-up current value in each at least one load;
    vi) obtaining a maximum current value in each at least one load at a specific moment;
    vii) comparing the maximum current value obtained in each at least one load at the specific moment and the maximum value of the current in each at least one load in the normal operating state;
    viii) comparing the maximum current value obtained in each at least one load at the specific moment and the maximum start-up current value of each at least one load; and
    ix) establishing said 'standby' state' when the maximum current value obtained in each at least one load is less than a percentage P of the maximum value of the current of each at least one load in the normal operating state.

11. The method for the detection of 'standby' state' according to claim 10, further comprising:
    determining whether the maximum current value obtained at the specific moment in each load is greater than the maximum current value in the normal operating state stored in the memory; and
    replacing the maximum current value for the normal operating state stored in the memory with the maximum current value obtained at the specific moment when the maximum current value for the specific moment is greater than the maximum current value for the normal operating state.

12. The method for the detection of 'standby' state' according to claim 10, further comprising:
   determining whether the maximum current value obtained at the specific moment in each load is less than the maximum current value in the normal operating state stored in the memory and greater than a percentage P of the maximum value of the current of each load in the normal operating state; and
   determining that the load is in normal operating state when the maximum current value for the specific moment is less than the maximum current value for the normal operating state stored in the memory and greater than the percentage P of the maximum value of the current of each load in the normal operating state.

13. The method for the detection of 'standby' state' according to claim 10, further comprising:
   determining whether the maximum current value obtained at the specific moment in each load is less than the maximum current value in the normal operating state stored in the memory and less than a percentage P of the maximum value of the current of each load in the normal operating state; and
   determining that the load is in 'standby' state when the maximum current value for the specific moment in each load is less than the maximum current value for the normal operating state and less than the percentage P of the maximum value of the current of each load in the normal operating state.

14. The method for the detection of 'standby' state' according to claim 10, further comprising:
   determining whether the maximum current value obtained at the specific moment in each load is less than the maximum current value in the normal operating state stored in the memory and less than a value U of the current of each load in the normal operating state; and
   determining that the load is disconnected when the maximum current value obtained at the specific moment in each load is less than the maximum current value in the normal operating state stored in the memory and less than the value U of the current of each load in the normal operating state.

15. The method for the detection of 'standby' state' according to claim 10, further comprising:
   determining a first value as the maximum start-up current value obtained minus a hysteresis HS value;
   determining a second value as the maximum start-up current value obtained plus the hysteresis HS value;
   determining whether the maximum current value obtained at the specific moment in each load is between the first value and the second value; and
   determining that the load is in 'standby' mode' from the start-up or connection when the load obtained at the specific moment is between the first value and the second value.

16. The method for the detection of 'standby' state' according to claim 10, wherein P is between 30% and 50%.

17. The method for the detection of 'standby' state' according to claim 16, wherein P is 50%.

18. The method for the detection of 'standby' state' according to claim 14, wherein U is approximately 100 mA.

19. The method for the detection of 'standby' state' according to claim 15, wherein HS is approximately 100 mA.

20. A system for the detection of 'standby' state' in linear and non-linear loads connected to an electric power grid and automatic disconnection of the linear and non-linear loads for achieving zero consumption in a system, the system comprising
   a memory;
   a means of timing;
   a means for detection; and
   a processing device operatively coupled to the memory and the means for detection device, wherein the processing device is configured to execute computer-readable program code to:
   a) detect a normal operating state of at least one load using the means for detection;
   b) obtain a maximum value of a current in the at least one load in the normal operating state;
   c) detect entry into a standby mode of the at least one load, wherein the standby mode is detected when a value of the current in the at least one load at a specific time is less than a percentage P of the maximum value of the current of the at least one load in the normal operating state;
   d) evaluate a value for a current of the at least one load for a predetermined time T using the means of timing; and
   e) disconnect the at least one load and the means for detection from all sources of electrical energy when the value of the at least one load does not return to the maximum value during the predetermined time T.

21. The system for the detection of 'standby' state' in linear and non-linear loads connected to the electric power grid and the automatic disconnection thereof, according to claim 20, further comprising means of reactivation of the system after the at least one load and the means for detection are disconnected.

* * * * *